United States Patent
Tapily

(10) Patent No.: US 10,062,564 B2
(45) Date of Patent: Aug. 28, 2018

(54) METHOD OF SELECTIVE GAS PHASE FILM DEPOSITION ON A SUBSTRATE BY MODIFYING THE SURFACE USING HYDROGEN PLASMA

(71) Applicant: Tokyo Electron Limited, Minato-ku, Tokyo (JP)

(72) Inventor: Kandabara N. Tapily, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/970,372

(22) Filed: Dec. 15, 2015

(65) Prior Publication Data

US 2016/0172189 A1 Jun. 16, 2016

Related U.S. Application Data

(60) Provisional application No. 62/092,157, filed on Dec. 15, 2014.

(51) Int. Cl.
| | |
|---|---|
| *H01L 21/02* | (2006.01) |
| *H01L 21/30* | (2006.01) |
| *H01L 21/768* | (2006.01) |
| *C23C 16/04* | (2006.01) |
| *C23C 16/40* | (2006.01) |
| *C23C 16/455* | (2006.01) |
| *C23C 16/511* | (2006.01) |

(52) U.S. Cl.
CPC ...... *H01L 21/02315* (2013.01); *C23C 16/045* (2013.01); *C23C 16/403* (2013.01); *C23C 16/405* (2013.01); *C23C 16/4554* (2013.01); *C23C 16/511* (2013.01); *H01L 21/0228* (2013.01); *H01L 21/02172* (2013.01); *H01L 21/02178* (2013.01); *H01L 21/02252* (2013.01); *H01L 21/02296* (2013.01); *H01L 21/02299* (2013.01); *H01L 21/3003* (2013.01); *H01L 21/76814* (2013.01); *H01L 21/76826* (2013.01); *H01L 21/76831* (2013.01); *H01L 21/76834* (2013.01); *H01L 21/76883* (2013.01)

(58) Field of Classification Search
CPC .......... H01L 21/02172; H01L 21/0228; H01L 21/02315; H01L 21/02252; H01L 21/02296; H01L 21/02299; H01L 21/3003
See application file for complete search history.

(56) References Cited

U.S. PATENT DOCUMENTS

| | | | |
|---|---|---|---|
| 9,768,060 B2 * | 9/2017 | Shaviv | ............. H01L 21/76843 |
| 2005/0106893 A1 | 5/2005 | Wilk | |
| 2006/0292872 A1 | 12/2006 | Haukka et al. | |
| 2007/0284629 A1 | 12/2007 | Marks et al. | |

(Continued)

*Primary Examiner* — Michael Jung
(74) *Attorney, Agent, or Firm* — Wood Herron & Evans LLP

(57) ABSTRACT

According to one embodiment of the invention, a method is provided for selective surface deposition. In one example, the method includes providing a substrate containing a first material having a first surface and a second material having a second surface, forming a modified first surface and a modified second surface by exposing the first surface and the second surface to hydrogen gas excited by a plasma source, and selectively depositing a film on the modified second surface but not on the modified first surface.

3 Claims, 9 Drawing Sheets

(56) References Cited

U.S. PATENT DOCUMENTS

2013/0196502 A1* 8/2013 Haukka ............ H01L 21/02068
438/653
2013/0320520 A1* 12/2013 Michalak ............ H01L 21/3105
257/734
2015/0037980 A1* 2/2015 Rha ...................... H01L 21/306
438/700

* cited by examiner

METHOD OF SELECTIVE GAS PHASE FILM DEPOSITION ON A SUBSTRATE BY MODIFYING THE SURFACE USING HYDROGEN PLASMA

CROSS-REFERENCE TO RELATED APPLICATIONS

This application is related to and claims priority to U.S. Provisional Patent Application Ser. No. 62/092,157 filed on Dec. 15, 2014, the entire contents of which are herein incorporated by reference.

FIELD OF THE INVENTION

The present invention generally relates to a method of selective deposition of a film on different material surfaces using gas phase deposition.

BACKGROUND OF THE INVENTION

As device size is getting smaller at the 14 nm technology node, the complexity in manufacturing is increasing. The cost to produce the semiconductor devices is also increasing and cost effective solutions and innovations are needed. As smaller transistors are manufactured, the critical dimension (CD) or resolution of patterned features is becoming more challenging to produce. Self-aligned patterning may replace overlay-driven patterning so that cost-effective scaling can continue even after EUV introduction. Patterning options that enable reduced variability, extend scaling and enhanced CD and process control are needed.

Selective deposition of thin films is a key step in patterning in highly scaled technology nodes. Selective film deposition has been achieved through the use of self-assembled monolayers (SAMs). However, SAMs suffer from poor thermal stability and added process complexity due to the requirement of depositing additional materials. New deposition methods are required that provide selective film deposition on different material surfaces.

SUMMARY OF THE INVENTION

A method for selective deposition of a film on different material surfaces using gas phase deposition is disclosed in various embodiments.

According to one embodiment of the invention, the method includes providing a substrate containing a first material having a first surface and a second material having a second surface, forming a modified first surface and a modified second surface by exposing the first surface and the second surface to hydrogen gas excited by a plasma source, and selectively depositing a film on the modified second surface but not on the modified first surface.

According to another embodiment of the invention, the method includes providing a substrate containing a first material having a first horizontal surface and a first vertical surface in a recessed feature formed in the first material, and a second material having a second surface in the recessed feature. The method further includes forming a modified first horizontal surface, a modified first vertical surface, and a modified second surface by exposing the substrate to hydrogen gas excited by a plasma source, and selectively depositing, by gas phase deposition, a film on the modified first vertical surface but not on the modified first horizontal surface.

According to yet another embodiment of the invention, the method includes providing a substrate containing a first material having a first surface and a second material having a second surface, where the first material is different from the second material, and both the first surface and second surface are at least substantially in the same plane. The method further includes forming a modified first surface and a modified second surface by exposing the substrate to hydrogen gas excited by a plasma source, where the first surface is hydroxyl terminated and the modified first surface is hydrogen terminated, and selectively depositing, by atomic layer deposition (ALD), a metal oxide film on the modified second surface but not on the modified first surface.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

Some embodiments of the invention provide a non-polymer based approach to selectively depositing a film (e.g., insulator or metal) on a desired surface of a substrate while inhibiting the film deposition on the rest of the substrate. This reduces or eliminates the need for additional patterning steps that normally include lithography and etching steps. The selective film deposition can be achieved after surface modification using hydrogen gas that is plasma excited and exposed to the substrate. According to one embodiment, the hydrogen gas may be excited using a microwave plasma source. According to other examples, other plasma sources may be used, including an inductively couple plasma (ICP) source and a capacitively coupled plasma (CCP) source.

Embodiments of the invention are described below in reference to the Figures. According to one embodiment, a method is provided for selective film deposition on a substrate. The method includes providing a substrate containing a first material having a first surface and a second material having a second surface, forming a modified first surface and a modified second surface by exposing the first surface and the second surface to hydrogen gas excited by a plasma source, and selectively depositing a film on the modified second surface but not on the modified first surface. According to one embodiment, a chemical oxide removal (COR) process may be performed prior to the hydrogen gas exposure to remove an oxide layer from the substrate.

In one example, selective film deposition is enabled by replacing hydroxyl groups (—OH) on a surface with hydrogen (—H) groups by exposing the substrate to a plasma-excited hydrogen gas. Deposition of many high dielectric constant (high-k) films is sensitive to the surface termination, where fast film deposition with little or no incubation period is observed on —OH terminated surfaces, but —H terminated surfaces can exhibit long incubation periods where initially little or no film deposition is observed.

Figure 1:
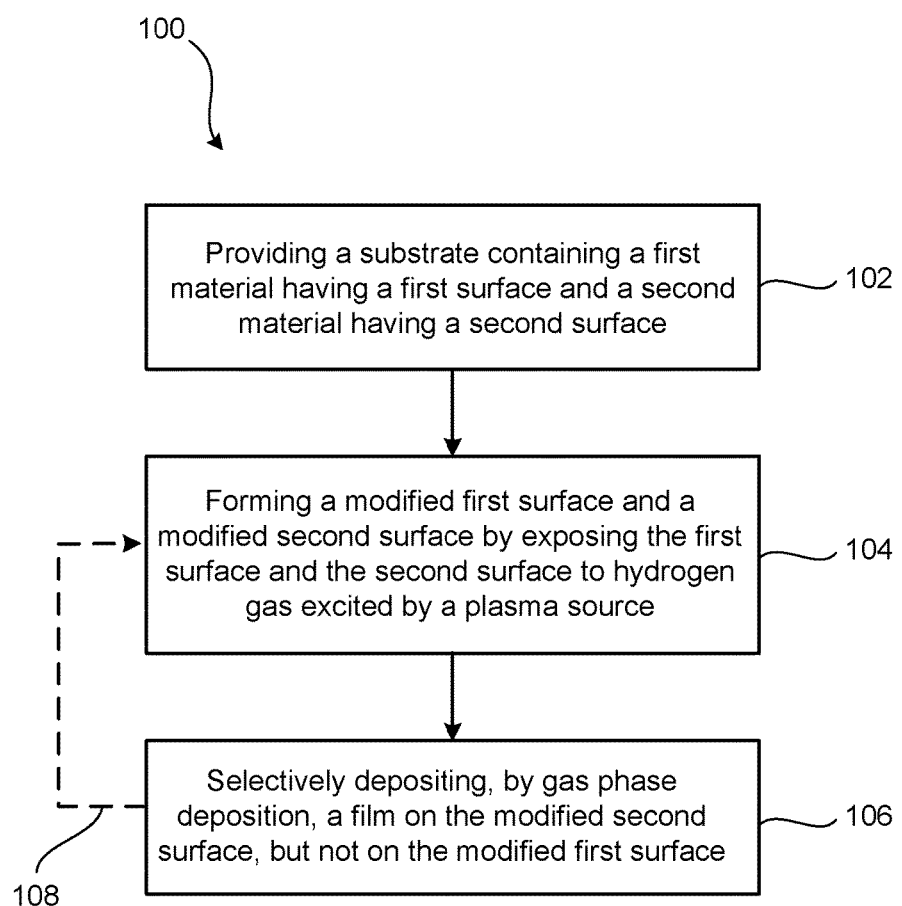
FIG. 1 shows a process flow for selective film deposition on a substrate according to an embodiment of the invention.

FIG. 1 shows a process flow for selective film deposition on a substrate according to an embodiment of the invention. The process flow 100 includes, in step 102, providing a substrate containing a first material having a first surface and a second material having a second surface, where the first and second materials may be the same materials or different materials. In one example, the first material may include a semiconductor (e.g., silicon (Si), silicon germanium (SiGe), germanium (Ge), or a III-V compound semiconductor), or a dielectric material, and the second material may include a metal (e.g., copper metal or tungsten metal), a metal-containing material (e.g., titanium nitride or tantalum nitride), or a semiconductor (Si, SiGe, Ge, or a III-V compound semiconductor). For example, the first surface may contain a thin layer of —OH terminated Si (Si—OH) and the second surface may contain an oxidized metal layer on (e.g., oxidized copper).

In step 104, the process flow 100 includes forming a modified first surface and a modified second surface by exposing the first surface and the second surface to hydrogen gas excited by a plasma source. In one example, the modified first surface may contain —H terminated Si (Si—H) following reaction of the hydrogen gas with Si—OH on the first surface and the modified second surface 202B may contain a clean metal surface.

In step 106, the process flow 100 includes selectively depositing, by gas phase deposition, a film on the modified second surface but not on the modified first surface. The film can, for example, be deposited by atomic layer deposition (ALD), plasma-enhanced ALD (PEALD), chemical vapor deposition (CVD), plasma-enhanced CVD (PECVD), or pulsed CVD. According to one embodiment, the film may include a metal oxide film (e.g., $Al_2O_3$, $HfO_2$, $ZrO_2$, or $TiO_2$). In some examples, a metal oxide film may be deposited by ALD using alternating exposures of a metal organic precursor and an oxidizer (e.g., $H_2O$, $H_2O_2$, plasma-excited $O_2$ or $O_3$). According to another embodiment, the film may include a capping layer containing SiN or $SiO_2$.

Steps 102 and 104 may be repeated at least once as indicated by process arrow 108. In one example, repeating steps 102 and 104 one or more times extends the incubation period and provides improved selective film deposition.

Figure 2A:
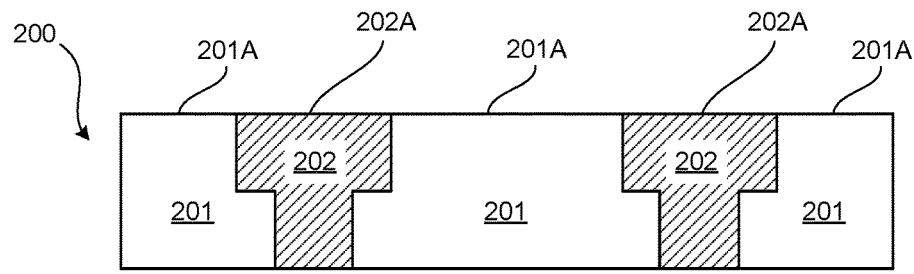
FIGS. 2A-2C schematically show cross-sectional views of selective film deposition on a substrate according to an embodiment of the invention.
Figure 2B:
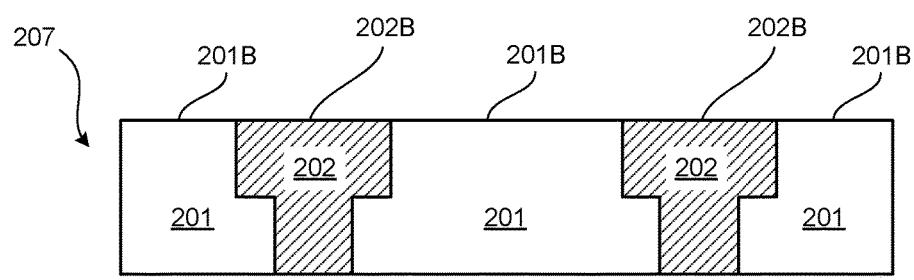
Figure 2C:
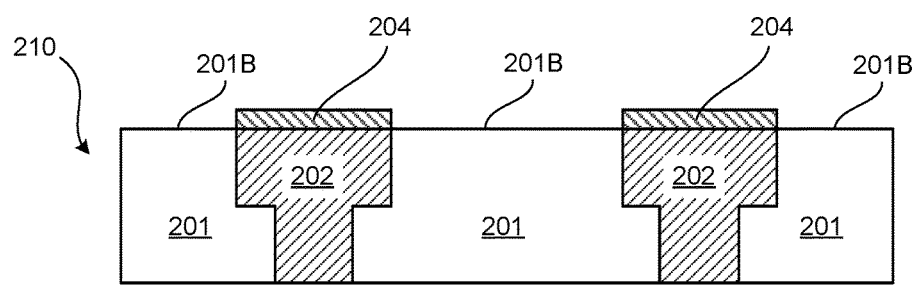

FIGS. 2A-2C schematically show cross-sectional views of selective film deposition on a substrate according to an embodiment of the invention. The substrate 200 in FIG. 2A includes a first material 201 having a first surface 201A, and a second material 202 having a second surface 202A. According to embodiments of the invention, the first material 201 is different than the second material 202 and the first surface 201A and the second surface 202A lie at least substantially in the same plane. For example, the first surface 201A may contain a thin layer of —OH terminated Si (Si—OH) and the second surface 202A may contain an oxidized metal layer on (e.g., oxidized copper).

The substrate 200 in FIG. 2A may be exposed to hydrogen gas excited by a plasma source to modify the first surface 201A to form a modified first surface 201B and to modify the second surface 202A to form a modified second surface 202B. The hydrogen gas exposure deactivates the first surface 201A and activates the second surface 202A for film deposition. This is schematically shown as substrate 207 in FIG. 2B. In one example, the modified first surface 201B may contain —H terminated Si (Si—H) following reaction of the hydrogen gas with the Si—OH and the modified second surface 202B may contain a clean metal surface.

Thereafter, as schematically shown in FIG. 2C, a film 204 is selectively deposited, by gas phase deposition, on the modified second surface 202B but not on the modified first surface 201B, to form the substrate 210. The selective film deposition may be achieved due to the longer incubation period on the modified first surface 201B compared to on the modified second surface 202B. Thus, the film 204 may be selectively deposited on the modified second surface 202B before any substantial film deposition occurs on the modified first surface 201B which has been deactivated by removing film nucleation sites. Examples of the first material 201, the second material 202 and the film 204 were described in reference to FIG. 1.

Figure 3A:
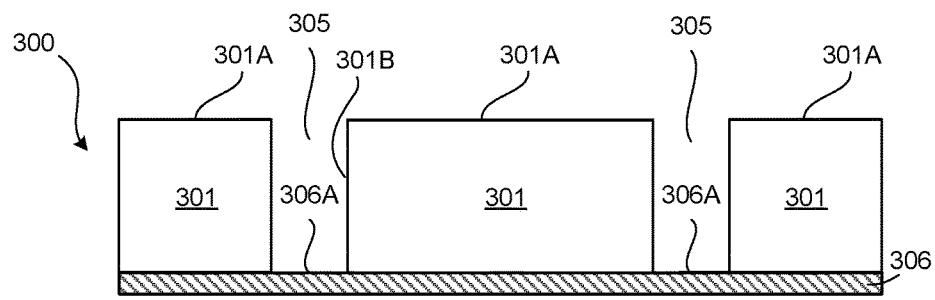
FIGS. 3A-3C schematically show cross-sectional views of selective film deposition on a substrate according to another embodiment of the invention.
Figure 3B:
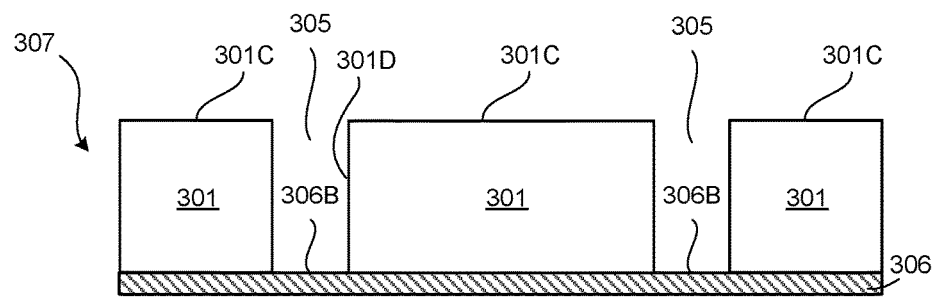
Figure 3C:
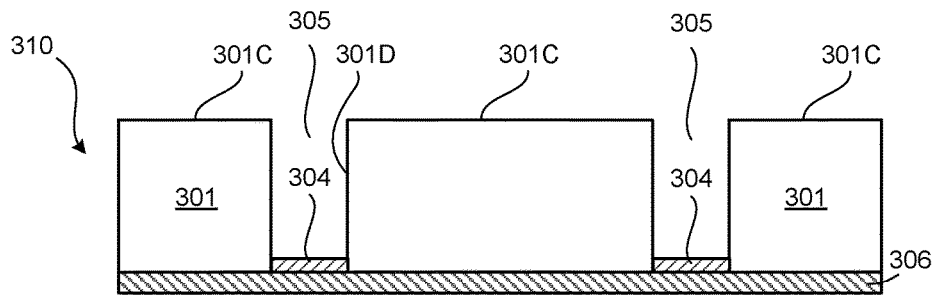

FIGS. 3A-3C schematically show cross-sectional views of selective film deposition on a substrate according to yet another embodiment of the invention. The substrate 300 in FIG. 3A includes a first material 301 having a first horizontal surface 301A and a first vertical surface 301B in a recessed feature 305 of the first material 301. The substrate 300 further contains a second material 306 having a second surface 306A, where the second surface 306A includes a surface of the second material in the recessed feature 305. According to embodiments of the invention, the first material 301 is different than the second material 306. In one example, the first material 301 may include silicon (Si) and the first horizontal surface 301A and the first vertical surface 301B can contain a thin layer of —OH terminated Si (Si—OH). The second surface 306A may contain an oxidized metal layer.

The substrate 300 in FIG. 3A may be exposed to hydrogen gas excited by a plasma source to form a modified substrate 307. The exposure modifies the first horizontal surface 301A to form a modified first horizontal surface 301C, modifies the first vertical surface 301B to form a modified first vertical surface 301D, and modifies the second surface 306A to form a modified second surface 306B. In one example, the modified first horizontal surface 301C and the modified first vertical surface 301D may contain —H terminated Si (S—H) following reaction of the hydrogen gas with the Si—OH, and the modified second surface 202B may contain a clean metal surface. According to one embodiment, the hydrogen gas exposure may be dominantly isotropic in nature in order to effectively modify the first horizontal surface 301A, the first vertical surface 301B, and the second surface 306A. This may be achieved, for example, by using a low substrate bias power or omitting substrate bias power during the exposure to the plasma-excited hydrogen gas. Using low substrate bias power or omitting substrate bias power exposes the substrate 300 predominantly to neutral hydrogen radicals in the plasma.

Thereafter, as schematically shown in FIG. 3C, a film 304 is selectively deposited, by gas phase deposition, to form substrate 310. The film 304 is selectively deposited on the modified second surface 306B but not on the modified first horizontal surface 301C and the modified first vertical surface 301D. The selective film deposition may be achieved due to the longer incubation period on the modified first horizontal surface 301C and on the modified first vertical surface 301D compared to on the modified second surface 306B. Thus, the film 304 may be selectively deposited on the modified second surface 306B before any substantial film deposition occurs on the modified first horizontal surface 301C and on the modified first vertical surface 301D due to lack of film nucleation sites. Examples of the film 404 were described in reference to FIG. 1. In some examples, the first material 301 may include a semiconductor (e.g., silicon (Si), silicon germanium (SiGe), germanium (Ge), or a III-V compound semiconductor), or a dielectric material, and the second material 306 may include a metal (e.g., copper metal or tungsten metal), a metal-containing material (e.g., titanium nitride or tantalum nitride), or a semiconductor (Si, SiGe, Ge, or a III-V compound semiconductor).

FIGS. 4A-4D schematically show cross-sectional views of selective film deposition according to other embodiments of the invention. The substrate 400 in FIG. 4A includes a first material 401 having a first horizontal surface 401A and a first vertical surface 401B in a recessed feature 405 of the first material 401. The substrate 400 further contains a second material 406 having a second surface 406A at the bottom of the recessed feature 405. According to some embodiments of the invention, the first material 401 may be the same as the second material 402. However, according to other embodiments, the first material 401 may be different from the second material 402. In one example, the first material 401 and the second material 402 may be selected from the group consisting of a semiconductor (e.g., silicon (Si), silicon germanium (SiGe), germanium (Ge), or a III-V compound semiconductor), or a dielectric material. For example, the first horizontal surface 401A, the first vertical surface 401B, and the second surface 406A may contain a thin layer of —OH terminated Si (Si—OH).

The substrate 400 may be exposed to hydrogen gas excited by a plasma source to modify the first horizontal surface 401A and the second surface 406A but to a lesser extent the first vertical surface 401B. In one example, the modified first horizontal surface 401C and the modified second surface 406B of substrate 407 in FIG. 4B may contain —H terminated Si and the modified first vertical surface 401D may contain —OH terminated Si. According to one embodiment, the hydrogen exposure may be dominantly anisotropic in order to preferentially modify the first horizontal surface 401A and the second surface 406A compared to the first vertical surface 401B. This may be achieved, for example, using a high substrate bias power during the plasma exposure. Using high substrate bias power exposes the first horizontal surface 401A and the second surface 406A to hydrogen ions from the plasma, thereby deactivating those surfaces for film deposition. Further, the first vertical surface 301B is less deactivated for film deposition due to the line-of-sight characteristics of the anisotropic exposure.

Figure 4A:
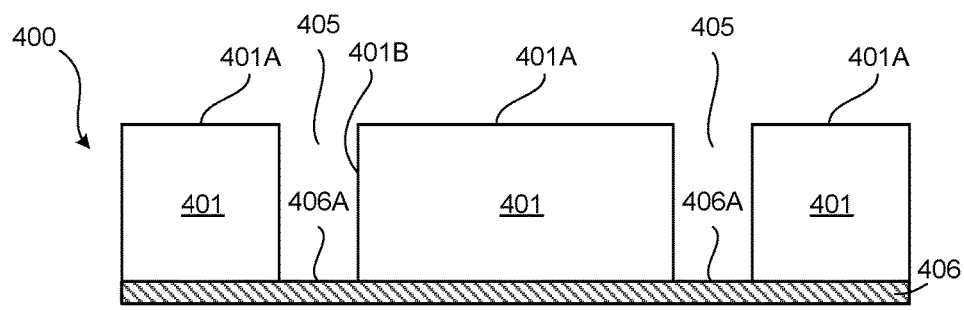
FIGS. 4A-4D schematically show cross-sectional views of selective film deposition on a substrate according to other embodiments of the invention.
Figure 4B:
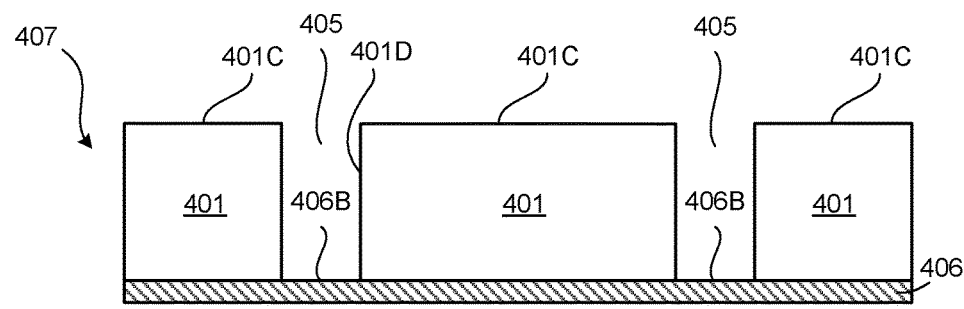
Figure 4C:
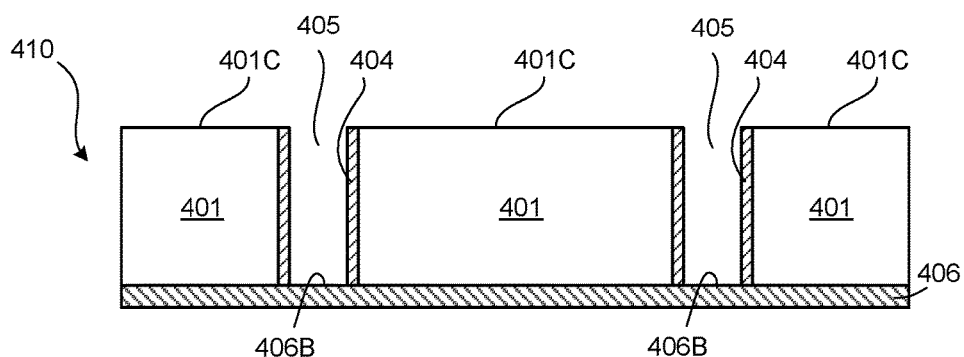
Figure 4D:
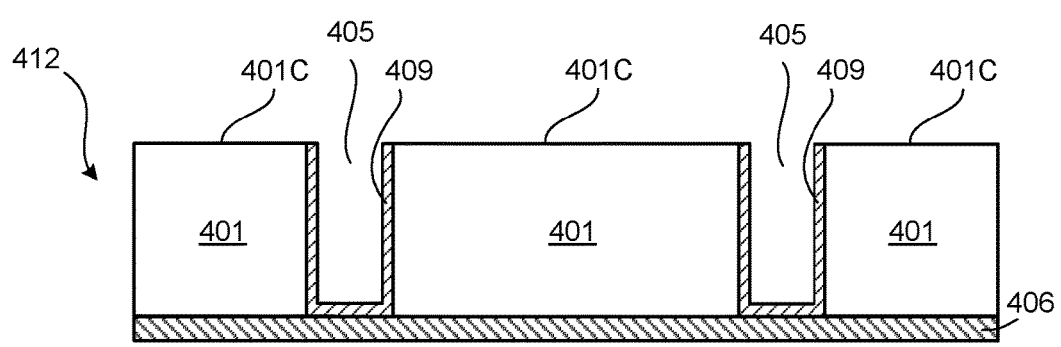

Thereafter, as schematically shown in FIG. 4C, a film 404 is selectively deposited, by gas phase deposition, on the modified first vertical surface 401D but not on the modified first horizontal surface 301C and the modified second surface 406B. The selective film deposition may be achieved due to the longer incubation period on the modified first horizontal surface 401C and on the modified second surface 406B compared to the modified first vertical surface 401D. Thus, the film 404 may be selectively deposited on the modified first vertical surface 401D before any substantial film deposition occurs on the modified first horizontal surface 401C and the modified second surface 406B due to lack of film nucleation sites. Examples of the film 404 were described in reference to FIG. 1.

Referring back to FIG. 4A, according to another embodiment of the invention, the first material 401 may be different from the second material 402, and in one example, the first material 401 may include a semiconductor (e.g., silicon (Si), silicon germanium (SiGe), germanium (Ge), or a III-V compound semiconductor), or a dielectric material, and the second material 406 may include a metal (e.g., copper metal or tungsten metal), a metal-containing material (e.g., titanium nitride or tantalum nitride), or a semiconductor (Si, SiGe, Ge, or a III-V compound semiconductor). For example, the first horizontal surface 401A and the first vertical surface 401B may contain a thin layer of —OH terminated Si (Si—OH) and the second surface 406A may contain an oxidized metal layer on (e.g., oxidized copper).

Thereafter, the substrate 400 may be exposed to hydrogen gas excited by a plasma source to modify the first horizontal surface 401A and the second surface 406A but to a lesser extent the first vertical surface 301B. In one example, the modified first horizontal surface 401C may contain —H terminated Si, the modified first vertical surface 401D may contain —OH terminated Si, and the modified second surface 406B may contain a clean metal surface. According to one embodiment, the hydrogen exposure may be dominantly anisotropic in order to preferentially modify the first horizontal surface 401A and the second surface 406A compared to the first vertical surface 401B. This may be achieved, for example, using a high substrate bias power during the plasma exposure. Using high substrate bias power exposes the first horizontal surface 401A and the second surface 406A to hydrogen ions from the plasma, thereby deactivating first horizontal surface 401A, and activating the second surface 406A for film deposition. Further, the first vertical surface 401B is less deactivated for film deposition due to the line-of-sight characteristics of the anisotropic exposure.

Thereafter, a film 409 is selectively deposited, by gas phase deposition, on the modified first vertical surface 401D and on the modified second surface 406B, but not on the modified first horizontal surface 401C. The selective film deposition shown as substrate 412 in FIG. 4D may be achieved due to the longer incubation period on the modified first horizontal surface 401C compared to on the modified first vertical surface 401D and the modified second surface 406B. Thus, the film 404 may be selectively deposited on the modified first vertical surface 401D and the modified second surface 406B before any substantial film deposition occurs on the modified first horizontal surface 401C due to lack of film nucleation sites. Examples of the film 409 were described in reference to FIG. 1.

Figure 5:
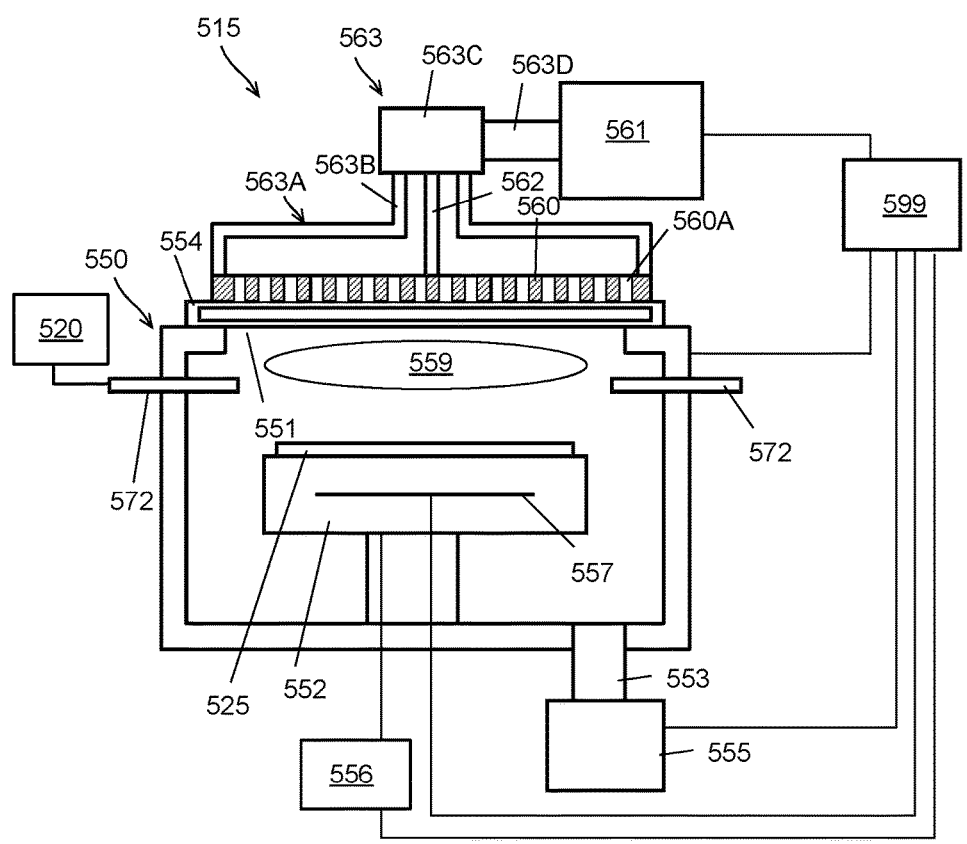
FIG. 5 is a schematic diagram of a plasma processing system containing a RLSA™ plasma for modifying a substrate according to one embodiment of the invention.

FIG. 5 is a schematic diagram of a plasma processing system containing a RLSA™ plasma for modifying a substrate according to one embodiment of the invention. The plasma produced in the plasma processing system 515 is characterized by low electron temperature and high plasma density. The plasma processing system 515 can, for example, be a TRIAS™ SPA processing system from Tokyo Electron Limited, Akasaka, Japan. The plasma processing system 515 contains a plasma processing chamber 550 having an opening portion 551 in the upper portion of the plasma processing chamber 550 that is larger than a substrate 525. A cylindrical dielectric top plate 554 made, for example, of quartz, aluminum nitride or aluminum oxide is provided to cover the opening portion 551.

Gas lines 572 are located in the side wall of the upper portion of plasma processing chamber 550 below the top plate 554. In one example, the number of gas lines 572 can be 16 (only two of which are shown in FIG. 5). Alternatively, a different number of gas lines 572 can be used. The gas lines 572 can be circumferentially arranged in the plasma processing chamber 550, but this is not required for embodiments of the invention. A process gas can be evenly and uniformly supplied into a plasma region 559 in plasma processing chamber 550 from the gas lines 572. A process gas containing hydrogen ($H_2$) and optionally a noble gas may be supplied by a gas source 520. The gas pressure in the plasma processing chamber can be less than 100 mTorr, less than 50 mTorr, less than 30 mTorr, or less than 20 mTorr, for example. Although not shown in FIG. 5, the process gas may also be provided into the plasma region 559 through the slot antenna 560.

In the plasma processing system 515, microwave power is provided to the plasma processing chamber 550 through the top plate 554 via a slot antenna 560 having a plurality of slots 560A. The slot antenna 560 faces the substrate 525 to be processed and the slot antenna 560 can be made from a metal plate, for example copper. In order to supply the microwave power to the slot antenna 560, a waveguide 563 is disposed on the top plate 554, where the waveguide 563 is connected to a microwave power supply 561 for generating electromagnetic wave at a microwave frequency of about 2.45 GHz, for example. The waveguide 563 contains a coaxial waveguide 563A with a lower end connected to the slot antenna 560, a coaxial waveguide 563B connected to the upper surface side of the circular (coaxial) waveguide 563A, and a coaxial waveguide converter 563C connected to the upper surface side of the coaxial waveguide 563B. Furthermore, a rectangular waveguide 563D is connected to the input of the coaxial waveguide converter 563C and an output for the microwave power supply 561.

Inside the coaxial waveguide 563B, an axial portion 562 (or inner conductor) of an electroconductive material is coaxially provided with the outer conductor, so that one end of the axial portion 562 is connected to the central (or nearly central) portion of the upper surface of slot antenna 560, and the other end of the axial portion 562 is connected to the upper surface of the coaxial waveguide 563B, thereby forming a coaxial structure. The microwave power can, for example, be between about 0.5 W/cm$^2$ and about 4 W/cm$^2$. Alternatively, the microwave power can be between about 0.5 W/cm$^2$ and about 3 W/cm$^2$. The microwave irradiation may contain a microwave frequency of about 300 MHz to about 10 GHz, for example about 2.45 GHz, and the plasma may contain an electron temperature of less than or equal to 5 eV, including 1, 1.5, 2, 2.5, 3, 3.5, 4, 4.5 or 5 eV, or any combination thereof. In other examples, the electron temperature can be below 5 eV, below 4.5 eV, below 4 eV, or even below 3.5 eV. In some examples, the electron temperature can be between 1 and 1.5 eV, between 1.5 and 2 eV, between 2 and 2.5 eV, between 2.5 and 3 eV, between 3.0 and 3.5 eV, between 3.5 and 4.0 eV, or between 4.0 and 4.5 eV. The plasma may have a density of about $1 \times 10^{11}$/cm$^3$ to about $1 \times 10^{13}$/cm$^3$, or higher.

In addition, in the plasma processing chamber 550, a substrate holder 552 is provided opposite the top plate 554 for supporting and heating a substrate 525 (e.g., a wafer). The substrate holder 552 contains a heater 557 to heat the substrate 525, where the heater 557 can be a resistive heater. Alternatively, the heater 557 may be a lamp heater or any other type of heater. Furthermore the plasma processing chamber 550 contains an exhaust line 553 connected to the bottom portion of the plasma processing chamber 550 and to a vacuum pump 555. The substrate holder 552 can be maintained at a temperature greater than 100° C., greater than 200° C., or greater than 300° C.

The plasma processing system 515 further contains a substrate bias system 556 configured to bias the substrate holder 552 and the substrate 525 for generating a plasma and/or controlling energy of ions that are drawn to a substrate 525. The substrate bias system 556 includes a substrate power source configured couple power to the substrate holder 552. The substrate power source contains a RF generator and an impedance match network. The substrate power source is configured to couple power to the substrate holder 552 by energizing an electrode in the substrate holder 552. A typical frequency for the RF bias can range from about 0.1 MHz to about 100 MHz, and can be 13.56 MHz. In some examples, the RF bias can be less than 1 MHz, for example less than 0.8 MHz, less than 0.6 MHz, less than 0.4 MHz, or even less than 0.2 MHz. In one example, the RF bias can be about 0.4 MHz. Alternatively, RF power is applied to the electrode at multiple frequencies. The substrate bias system 556 is configured for supplying RF bias power can be between 0 W and 100 W, between 100 W and 200 W, between 200 W and 300 W, between 300 W and 400 W, or between 400 W and 500 W. RF bias systems for plasma processing are well known to those skilled in the art. Further, the substrate bias system 556 includes a DC voltage generator capable of supplying DC bias between −5 kV and +5 kV to the substrate holder 552.

The substrate bias system 556 is further configured to optionally provide pulsing of the RF bias power the pulsing frequency can be greater than 1 Hz, for example 2 Hz, 4 Hz, 6 Hz, 8 Hz, 10 Hz, 20 Hz, 30 Hz, 50 Hz, or greater. Exemplary RF bias power can be less than 100 W, less than 50 W, or less than 25 W, for example. It is noted that one skilled in the art will appreciate that the power levels of the substrate bias system 556 are related to the size of the substrate 525 being processed. For example, a 300 mm Si wafer requires greater power consumption than a 200 mm wafer during processing.

Still referring to FIG. 5, a controller 599 includes a microprocessor, a memory, and a digital I/O port capable of generating control voltages sufficient to communicate and activate inputs of the plasma processing system 515 as well as monitor outputs from the plasma processing system 515. Moreover, the controller 599 is coupled to and exchanges information with plasma processing chamber 550, the vacuum pump 555, the heater 557, the substrate bias system 556, and the microwave power supply 561. A program stored in the memory is utilized to control the aforementioned components of plasma processing system 515 according to a stored process recipe. One example of controller 599 is a UNIX-based workstation. Alternatively, the controller 599 can be implemented as a general-purpose computer, digital signal processing system, etc.

Figure 6:
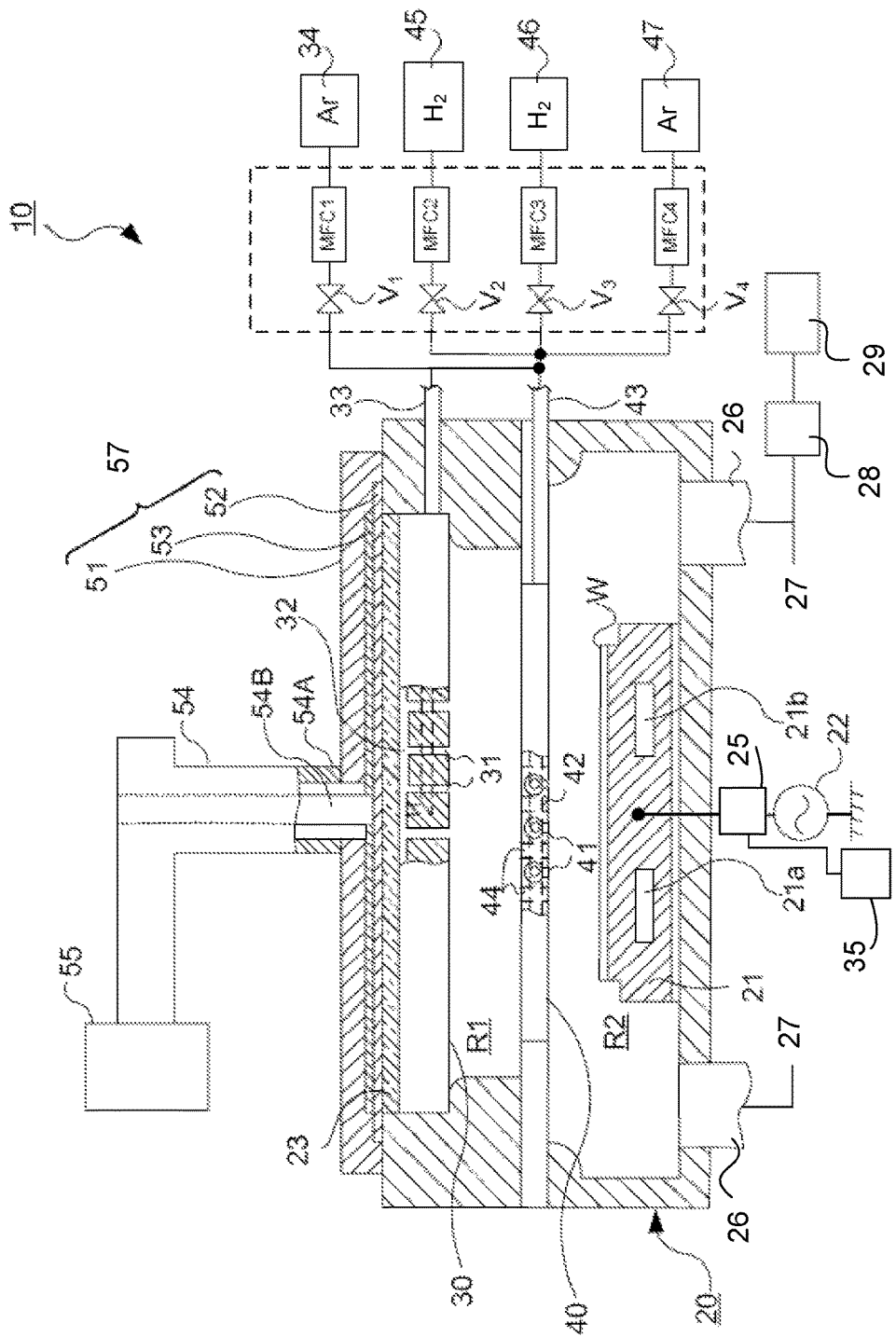
FIG. 6 is a schematic diagram of another plasma processing system containing a RLSA™ plasma for modifying a substrate according to an embodiment of the invention.

FIG. 6 is a schematic diagram of a plasma processing system containing a RLSA™ plasma for modifying a substrate according to another embodiment of the invention. As shown in this figure, plasma processing system 10 includes a plasma processing chamber 20 (vacuum chamber), an antenna unit 57, and a substrate holder 21. The interior of the plasma processing chamber 20 is roughly sectionalized into a plasma generation region R1, located below a plasma gas supply unit 30, and a plasma diffusion region R2 at the substrate holder 21 side. The plasma generated in the plasma generation region R1 can have an electron temperature of several electron volts (eV). When the plasma is diffused into the plasma diffusion region R2, wherein the film formation process is performed, the electron temperature of the plasma near the substrate holder 21 drops to a value of lower than about 2 eV. The substrate holder 21 is located centrally on a bottom portion of the plasma processing chamber 20 and serves as a mounting unit for mounting a substrate W. Within the substrate holder 21, there is provided an insulating member 21a, a cooling jacket 21b, and a temperature control unit, not shown in this figure, for controlling the substrate temperature.

A top portion of the plasma processing chamber 20 is open-ended. The plasma gas supply unit 30 is placed opposite to the substrate holder 21 and is sealed with the top portion of the plasma processing chamber 20 via sealing members, not shown in this figure, such as 0 rings. The plasma gas supply unit 30, which may also function as a dielectric window, is made of materials such as aluminum oxide or quartz, and its planar surface, which has a virtual disk shape, faces the substrate holder 21. A plurality of gas supply holes 31 are provided opposite to the substrate holder 21 on the planar surface of the plasma gas supply unit 30. The plurality of gas supply holes 31 communicate with a plasma gas supply port 33 via a gas flow channel 32. Plasma gas supply sources 34, 45, 46, 47 provide plasma gas such as $H_2$ gas and Ar gas into the plasma gas supply port 33. The plasma gas is then uniformly supplied into the plasma generation region R1 via the plurality of gas supply holes 31.

The plasma processing system 10 further includes a process gas supply unit 40, which is located substantially at the center of the plasma processing chamber 20 between the plasma generation region R1 and the plasma diffusion region R2. The process gas supply unit 40 is made of conducting materials such as aluminum alloy including magnesium (Mg) or stainless steel. Similar to the plasma gas supply unit 30, a plurality of gas supply holes 41 are provided on a planar surface of the process gas supply unit 40. The planar surface of the process gas supply unit 40 is positioned opposite to the substrate holder 21 and has a disk shape.

The plasma processing chamber 20 further includes exhaust lines 26 connected to the bottom portion of the plasma processing chamber 20, a vacuum line 27 connecting the exhaust line to a pressure controller valve 28 and to a vacuum pump 29. The pressure controller valve 28 may be used to achieve a desired gas pressure in the plasma processing chamber 20.

Figure 7:
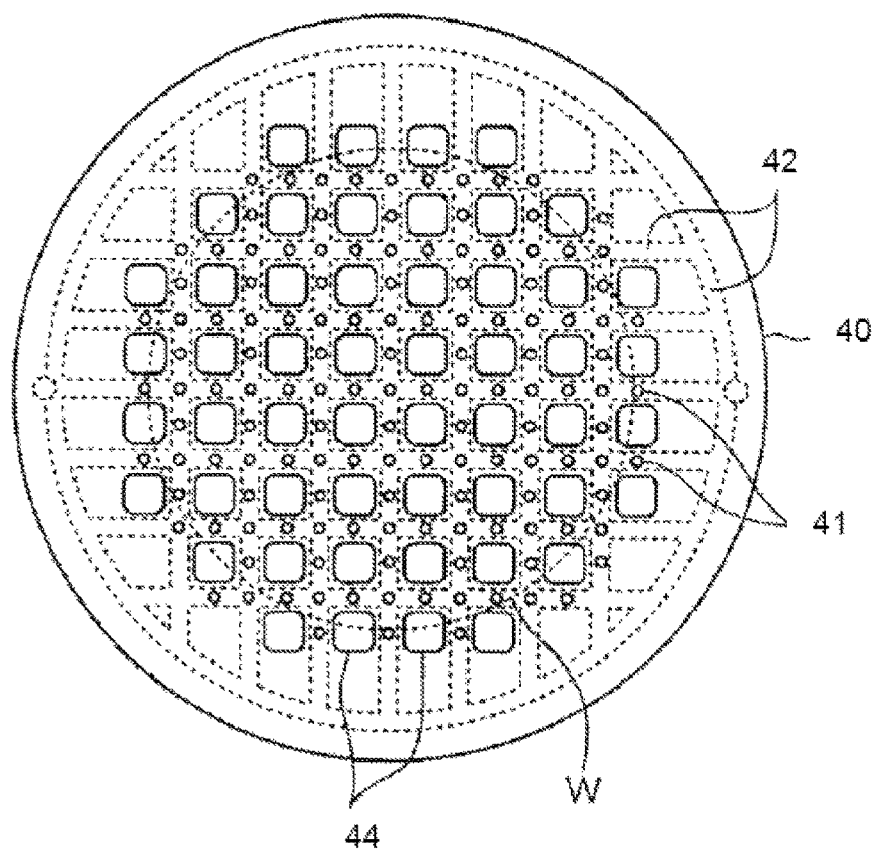
FIG. 7 illustrates a plan view of a gas supplying unit of the plasma processing system in FIG. 6.

A plan view of the process gas supply unit 40 is shown in FIG. 7. As shown in this figure, a grid-like gas flow channel 42, also called a shower plate, is formed within the process gas supply unit 40. The grid-like gas flow channel 42 communicates with an upper-end of the plurality of gas supply holes 41, which are formed in the vertical direction. The lower end of the plurality of gas supply holes 41 are openings facing the substrate holder 21. The plurality of gas supply holes 41 communicate with a process gas supply port 43 via the grid-patterned gas flow channel 42.

Figure 8:
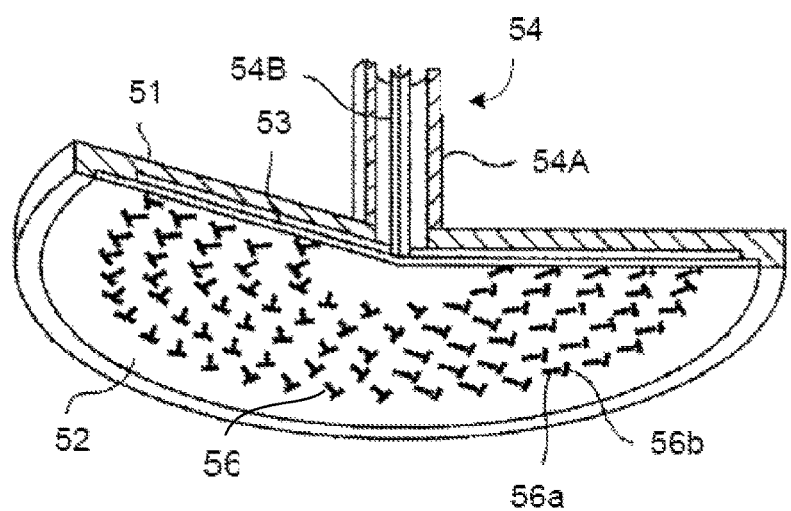
FIG. 8 illustrates a partial cross-sectional view of an antenna portion of the plasma processing system in FIG. 6.

Further, a plurality of openings 44 are formed on to the process gas supply unit 40 such that the plurality of openings 44 pass through the process gas supply unit 40 in vertical direction. The plurality of opening 44 passes the plasma gas, e.g., $H_2$ gas and optionally Ar gas, into the plasma diffusion region R2 on the side of the substrate holder 21. As shown in FIG. 8, the plurality of openings 44 are formed between the adjacent gas flow channels 42. The process gas is supplied, for example, from separate process gas supply sources 45 and 46 to the process gas supply port 43. According to some embodiments, any combination of $H_2$ and Ar may be flowed through the process gas supply unit 40 and/or through the plasma gas supply port 33. Furthermore, for example, the plurality of openings 44 may occupy a region on the process gas supply unit 40 that extends beyond a peripheral edge of the substrate W.

The process gas flows through the grid-like gas flow channel 42 and are uniformly supplied into the plasma diffusion region R2 via the plurality of gas supply holes 41. The plasma processing system 10 further includes four valves (V1-V4) and four flow rate controller (MFC1-MFC4) for respectively controlling a supply of the gases into the plasma processing chamber 20.

An external microwave generator 55 provides a microwave signal (or microwave energy) of a predetermined frequency, e.g., 2.45 GHz, to the antenna unit 57 via a coaxial waveguide 54. The coaxial waveguide 54 may include an inner conductor 54B and an outer conductor 54A. The microwave from the microwave generator 55 generates an electric field just below the plasma gas supply unit 30, in the plasma generation region R1, which in turn causes excitation of the process gas within the plasma processing chamber 20.

FIG. 8 illustrates a partial cross-sectional view of the antenna unit 57. As shown in this figure, the antenna unit 57 may include a flat antenna main body 51, a radial line slot plate 52, and a dielectric plate 53 to shorten the wavelength of the microwave. The flat antenna main body 51 has a circular shape with an open-ended bottom surface. The radial line slot plate 52 is formed to close the open-ended bottom surface of the flat antenna main body 51. The flat antenna main body 51 and the radial line slot plate 52 are made of a conductive material with a flat hollowed circular shape waveguide.

A plurality of slots 56 is provided on the radial line slot plate 52 to generate a circular polarized wave. The plurality of slots 56 is arranged in a substantially T-shaped form having a slight gap there between, in a concentric circle pattern or a spiral pattern along a circumferential direction. Since the slots 56a and 56b are perpendicular to each other, a circular polarized wave containing two orthogonal polarized components is radiated, as a plane wave, from the radial line slot plate 52.

The dielectric plate 53 is made of a low loss dielectric material, e.g., aluminum oxide ($Al_2O_3$) or silicon nitride ($Si_3N_4$), which is located between the radial line slot plate 52 and the flat antenna main body 51. The radial line slot plate 52 is mounted on the plasma processing chamber 20 using sealing members (not shown), such that the radial line slot plate 52 is in close contact with a cover plate 23. The cover plate 23 is located on the upper surface of plasma gas supply unit 30 and is formed from a microwave transmissive dielectric material such as aluminum oxide ($Al_2O_3$).

An external high-frequency power supply source 22 is electrically connected to the substrate holder 21 via a matching network 25. The external high-frequency power supply source 22 generates an RF bias power of a predetermined frequency, e.g. 13.56 MHz, for controlling ions energy that are drawn to the substrate W. The power supply source 22 is further configured to optionally provide pulsing of the RF bias power the pulsing frequency can be greater than 1 Hz, for example 2 Hz, 4 Hz, 6 Hz, 8 Hz, 10 Hz, 20 Hz, 30 Hz, 50 Hz, or greater. The power supply source 22 is configured for supplying RF bias power can be between 0 W and 100 W, between 100 W and 200 W, between 200 W and 300 W, between 300 W and 400 W, or between 400 W and 500 W. It is noted that one skilled in the art will appreciate that the power levels of the power supply source 22 are related to the size of the substrate being processed. For example, a 300 mm Si wafer requires greater power consumption than a 200 mm wafer during processing. The plasma processing system 10 further includes DC voltage generator 35 capable of supplying DC voltage bias between about −5 kV and about +5 kV to the substrate holder 21.

During the plasma exposure, the plasma gas, e.g., $H_2$ gas and optionally Ar gas, may be introduced into the plasma processing chamber 20 using the plasma gas supply unit 30. On the other hand, the process gas may be introduced into the plasma processing chamber 20 using the process gas supply unit 40.

Figure 9:
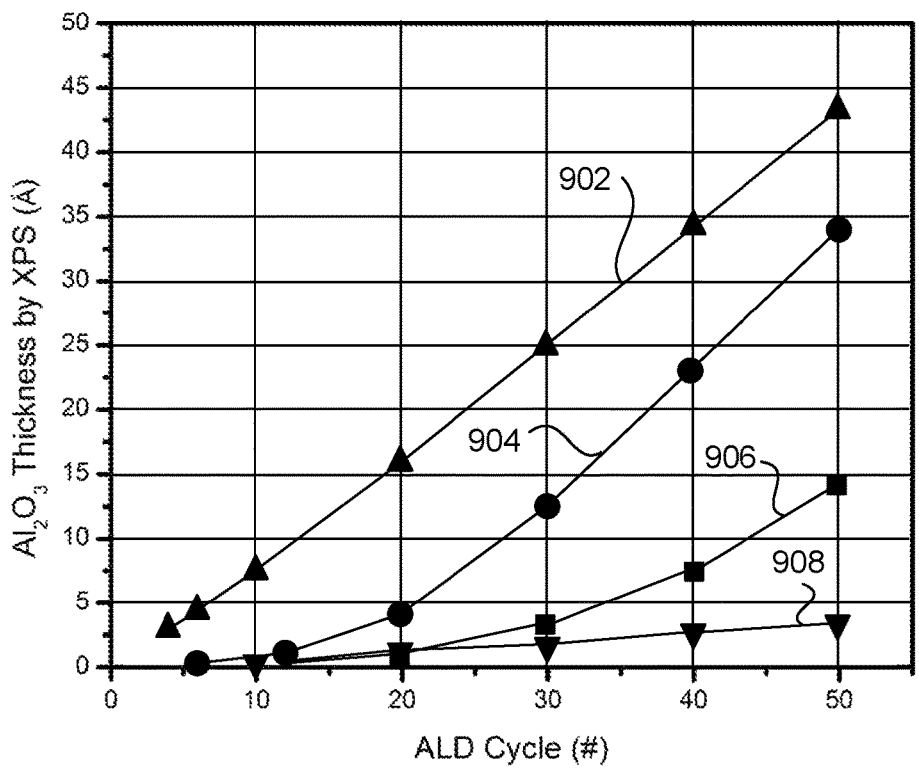
FIG. 9 shows experimental results for selective film deposition on a substrate using surface modification according to embodiments of the invention.

FIG. 9 shows experimental results for selective film deposition on a substrate using surface modification according to embodiments of the invention. The as-received Si substrates had a chemical oxide layer formed thereon containing oxidized Si terminated with hydroxyl groups. The Si substrates were modified using different surface treatments, and thereafter an $Al_2O_3$ ALD process was performed. The ALD process was performed at 250° C. by using alternating gaseous exposures of an aluminum precursor (e.g., $AlMe_3$) and an $H_2O$ oxidizer, and FIG. 9 shows $Al_2O_3$ film thickness as a function of ALD cycles.

Trace 902 shows the thickness of an $Al_2O_3$ film that was deposited on a chemical oxide layer without surface modification. The deposition of the $Al_2O_3$ film was linear with the number of ALD cycles, thus illustrating good $Al_2O_3$ film deposition characteristics on the Si—OH surface with little or no incubation period and a deposition rate of about 1 Angstrom/ALD cycle.

Trace 904 shows the thickness of an $Al_2O_3$ film that was deposited following a chemical oxide removal (COR) process. The COR process forms a hydrophobic surface but the incubation period during the $Al_2O_3$ deposition is relatively short. The deposition of the $Al_2O_3$ film showed an incubation period of about 15 ALD cycles, and thereafter an $Al_2O_3$ film was deposited on the substrate with a deposition rate of about 1 Angstrom/cycle.

Trace 906 shows the thickness of an $Al_2O_3$ film that was deposited following a (a) COR process and (b) an exposure to hydrogen gas that was plasma excited by a microwave plasma source. The deposition of the $Al_2O_3$ film showed an incubation period of about 25 ALD cycles and thereafter an $Al_2O_3$ film was deposited on the substrate.

Trace 908 shows the thickness of an $Al_2O_3$ film that was deposited following a (a) COR process and, thereafter, (b) an exposure to hydrogen gas that was plasma excited by a microwave plasma source. No substrate bias was applied to the substrate during the exposure to the hydrogen gas. The $Al_2O_3$ ALD process was performed with 10 ALD cycles. Thereafter, the hydrogen gas exposure was repeated every 10 $Al_2O_3$ ALD cycles. Trace 908 shows very little $Al_2O_3$ deposition on the modified Si surface and the repetition of the hydrogen exposure and the $Al_2O_3$ ALD process extends the incubation period and provides improved selective deposition of the $Al_2O_3$ film.

A plurality of embodiments for selective deposition of a film on different material surfaces using gas phase deposition have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. It is therefore intended that the scope of the invention be limited not by this detailed description, but rather by the claims appended hereto.

What is claimed is:

1. A method of selective film deposition on a substrate, the method comprising:
   providing the substrate containing a first material having a first surface and a second material having a second surface, wherein the first material comprises a silicon semiconductor, wherein the first material is different from the second material, and both the first surface and the second surface are at least substantially in the same plane;
   forming a modified first surface and a modified second surface by exposing the substrate to hydrogen gas excited by a plasma source, wherein the first surface is hydroxyl terminated and the modified first surface is hydrogen terminated; and
   selectively depositing, by atomic layer deposition (ALD), a metal oxide film on the modified second surface but not on the modified first surface.

2. The method of claim 1, further comprising:
   repeating the exposing the substrate to hydrogen gas excited by the plasma source and the selectively depositing at least once.

3. The method of claim 1, wherein the forming includes isotropically exposing the substrate to hydrogen radicals.

* * * * *